United States Patent [19]

McConnell

[11] Patent Number: 4,598,456
[45] Date of Patent: Jul. 8, 1986

[54] ASSEMBLY SYSTEM FOR ELECTRONIC CIRCUIT BOARDS

[75] Inventor: William P. McConnell, Columbia, Md.

[73] Assignee: Westinghouse Electric Corp., Pittsburgh, Pa.

[21] Appl. No.: 662,647

[22] Filed: Oct. 19, 1984

[51] Int. Cl.[4] .................. B23Q 17/00; B23Q 15/00; H05K 3/30; B25J 19/02
[52] U.S. Cl. .................. 29/407; 29/33 K; 29/464; 29/593; 29/703; 29/721; 29/741; 29/759; 29/833; 29/835; 414/730; 414/735; 414/786; 901/9; 901/45; 901/47
[58] Field of Search .............. 29/33 K, 407, 464, 559, 29/703, 721, 741, 759, 593, 833, 835; 414/730, 735, 786; 901/9, 45, 46, 47

[56] References Cited

U.S. PATENT DOCUMENTS

| | | | |
|---|---|---|---|
| 3,815,204 | 6/1974 | Feldman | 29/833 |
| 4,127,936 | 12/1978 | Schlup et al. | 29/721 |
| 4,146,924 | 3/1979 | Birk et al. | 901/47 X |
| 4,305,130 | 12/1981 | Kelley et al. | 901/9 X |
| 4,396,945 | 8/1983 | DiMatteo et al. | 901/9 X |
| 4,412,293 | 10/1983 | Kelley et al. | 901/9 X |
| 4,472,668 | 9/1984 | Mutschler et al. | 29/833 X |

Primary Examiner—Howard N. Goldberg
Assistant Examiner—Ronald S. Wallace
Attorney, Agent, or Firm—W. G. Sutcliff

[57] ABSTRACT

A system for automatically inserting the leads of electrical components into circuit boards is disclosed. In the preferred embodiment, an electrical component is acquired by the robot. The leads of the component have been trimmed and preformed such that they are substantially parallel with respect to each other with the leads differing in length. The robot positions the component at a fixed location relative to the axis of the robot and within the view of an optical sensor such as a TV camera. The sensor determines the location of each of the leads relative to a fixed location. A first rotary motion rotates the component about a selected axis of the robot through a predetermined angle and a second measurement is made. A second rotation positions the component 180° from the original position and a third measurement is made. Since the angles through which the component is rotated are known, the distance or radius of rotation of each of the leads can be calculated using the known axis of rotation and the radius of rotation, the precise location of each of the leads with respect to the robot is calculated. From the results of these calculations, the longest lead is partially inserted in the desired hole in a circuit board. The component is repositioned, as necessary, for insertion of the second longest lead. This process is repeated to insert all of the leads of the component.

8 Claims, 10 Drawing Figures

ASSEMBLY SYSTEM FOR ELECTRONIC CIRCUIT BOARDS

BACKGROUND OF THE INVENTION

1. Field of the Invention:

The invention relates to robots and more specifically to robots for assembling electronic circuits with the position of the leads of the component to be assembled determined by sequentially rotating the component about an axis of rotation and calculating the locations of each of the leads with respect to the axis of rotation.

2. Description of the Prior Art:

Automated equipment for assembling elecrical circuit boards is known in the art. The successful operation of automated assembly equipment depends upon the capability of determining the location of the leads of electrical components to be inserted into a printed circuit board with sufficient accuracy to permit the leads to be inserted without excessive interference between the component leads and the edges of the hole into which the lead is to be inserted. In applications where sufficient dimensional tolerances between the size of the lead and the circuit board holes into which the leads are to be inserted is available, the leads of components such as resistors may be trimmed and prebent with sufficient accuracy to permit the leads to be inserted without undue difficulty. Prior art automated assembly systems have attempted to locate the tips of the leads using vision systems having an optical axis substantially parallel to the leads. These techniques have encountered operational difficulties when accurate position of the leads was required.

SUMMARY OF THE INVENTION

The preferred embodiment of the invention utilizes a gripper mounted on a robot or similar automated insertion apparatus to insert components into a printed circuit board. More specifically, the leads of the components to be assembled in the circuit board are trimmed and preformed such that the leads of the components are substantially parallel to each other with each lead of a multi-lead component differing from all other leads in length by a predetermined value. The component to the inserted into the printed circuit board is acquired by the robot and held by the gripper such that the leads extend downwardly from the component in a substantially vertical direction. A first visual (preferably TV) image of the downwardly extending leads is acquired by moving the robot to position the component at a predetermined position in front of a visual sensor (preferably a TV camera). A first rotary motion about the vertical axis of the gripper rotates the leads of the components through a predetermined angle and a second TV image is acquired and stored. A second rotary motion about the vertical axis of the gripper is utilized to rotate the component and its downward extending leads through an angle of 180° with respect to the original position and a third TV image of the lead position is acquired and stored. The different lengths of the individual leads permits each lead to be uniquely identified in each of the images. From these TV images, the position of each of the leads of the component relative to the rotational axis of the gripper and the robot is calculated. Utilizing this information, the robot is then commanded to move such that the longest lead of the component is immediately above the hole in the circuit board into which it is to be inserted. A downward motion slightly inserts the longest lead and then the robot is commanded to move to a position such that the second longest lead is immediately over the opening into which it is to be inserted. This process is sequentially repeated until all of the leads of the component are inserted into the appropriate openings in the circuit board. Of course, the vertical position of the leads is arbitary. That is, this orientation is selected as a matter of convenience. Also, it is convenient to "back light" the leads because this conveniently produces sharp high contrast images.

BRIEF DESCRIPTION OF THE DRAWINGS

FIGS. 1 through 7 illustrates the rotation of a component to generate data for determining the position of the leads of the component;

DESCRIPTION OF THE PREFERRED EMBODIMENTS

Figure 1:
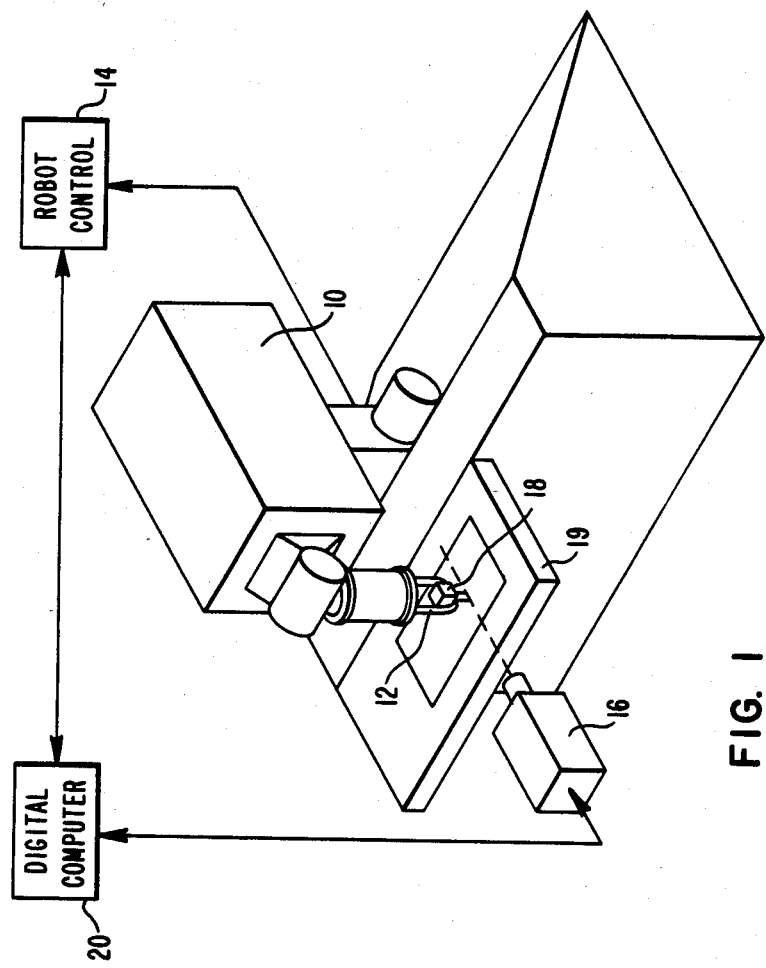
FIG. 1 is a functional block diagram of the hardware comprising the system.
Figure 2:
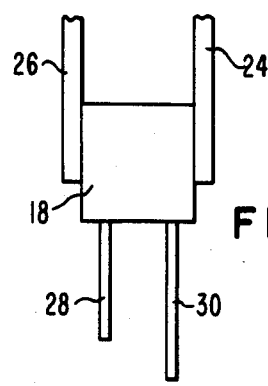

FIG. 1 is a somewhat functional diagram of the apparatus comprising the preferred embodiment of the invention. A conventional robot 10 has a gripper 12 affixed to the movable arm of the robot 10. Control commands are supplied to the robot 10 by a conventional robot controller 14 permitting the movable arm to move in all directions. A conventional TV camera 16 is positioned at a location such that the robot 10 can position a component 18 held in the jaws of the gripper 12 within the field of view of the TV camera 16. Video signals from the TV camera 16 are coupled to a digital computer 20. The digital computer 20 communicates with the robot control 16 to complete the coordination of the system to insert the leads of the component 18 into holes on the circuit board 19. (This process is described and illustrated in more detail later.) Conventional "back lighting" techniques can be used to back light the component 18 in order to produce high contrast images of the component leads.

Operation of the system illustrated in FIG. 1 with respect to the process for determining the precise location of leads of a component 18 to be inserted into a printed circuit board 19 will be described with reference to FIGS. 2 through 7. More specifically, a component 18 is acquired by the robot 10 by causing the two fingers of the gripper mechanism 24 and 26 to contact the outer edges of the component 18 and apply sufficient force to support the component 18. The robot 10 positions the component 18 in the field of view of TV camera 16 such that the two leads 28 and 30 of the component 18 are in a plane which is substantially 90° with respect to the optical axis of the TV camera 16. With the component 18 in this orientation, the TV camera 16 produces a binary image of the leads 28 and 30. These images are illustrated at reference numeral 28a and 30a, FIG. 3. From this image, the computer calculates the distance $\Delta X1$ and $\Delta X1'$ which defines the distance of each of the leads from a reference edge 32 of this TV image.

Figure 4:
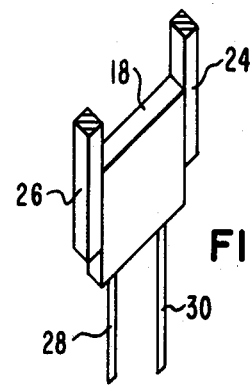
Figure 3:
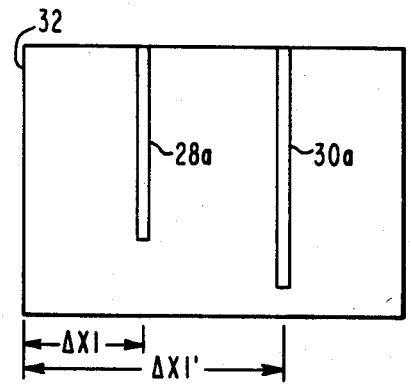
Figure 5:
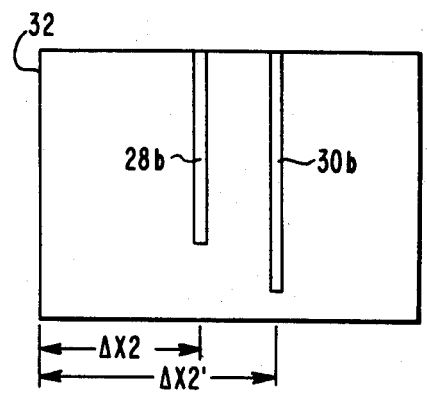

In order the produce a second TV image of the component 18, the robot 10 is commanded to rotate the component 18 counterclockwise through a predetermined angle, 60°, for example, as illustrated in FIG. 4. A second TV image of the leads is produced with the resultant images of the leads is illustrated at 28b and 30b in FIG. 5. From this image, second distances ΔX2 and ΔX2' are measured which gives the distance of the leads 28 and 30 from the reference edge 32 with the component oriented in this orientation.

Figure 6:
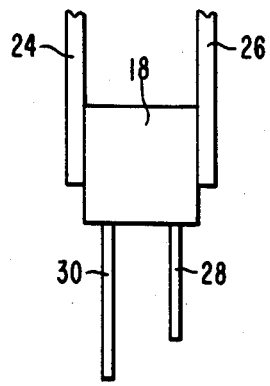
Figure 7:
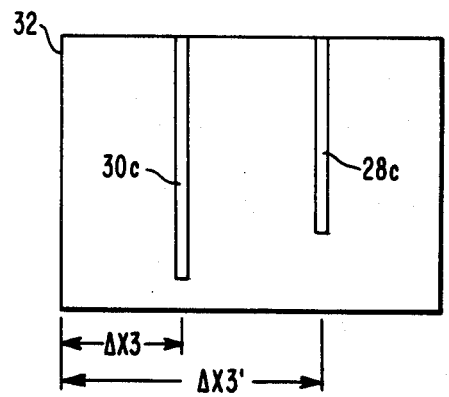

A third TV image is generated by commanding the robot 10 to orient the component 18 180° from its original position. This orientation is illustrated in FIG. 6. In this orientation, a third TV image of the leads 28 and 30 is generated as illustrated in FIG. 7. This gives two new distances ΔX3 and ΔX3' respectfully identifying the distances from the reference edge 32 to the leads 28 and 30.

Figure 8:
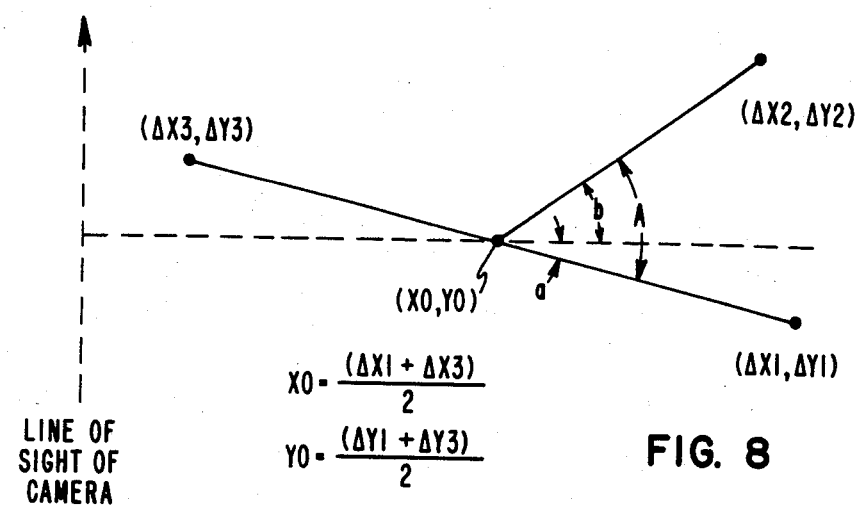
FIG. 8 is a diagram illustrating the mathematics of the lead position calculation.
Figure 9:
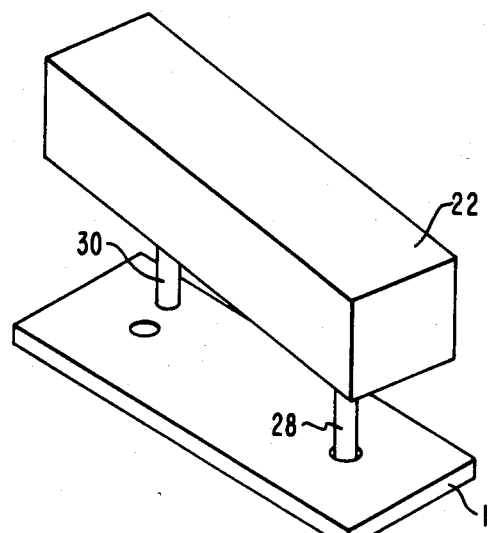
FIG. 9 illustrates the insertion of the longest lead of the component into the circuit board.
Figure 10:
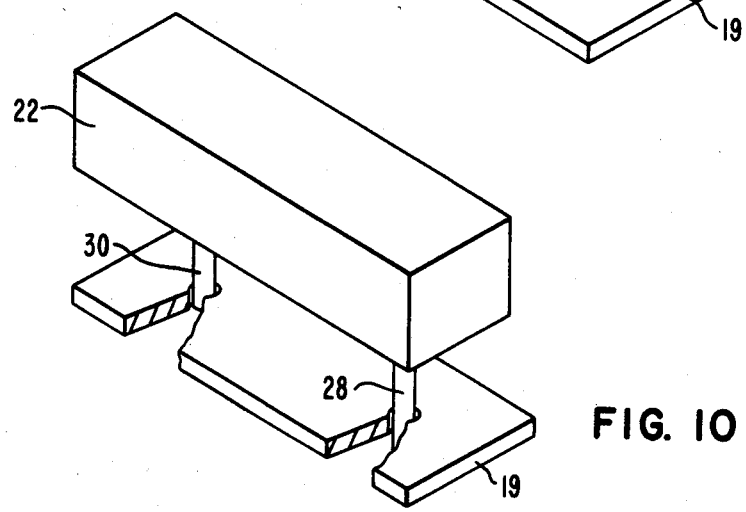
FIG. 10 illustrates the illustration of the shorter leads in the circuit board.

FIG. 8 is a diagram illustrating the position of the longest lead 28 with respect to the point about which the lead is rotated, specifically point XO and YO. From this diagram, the various distances of the longest lead 30 can be calculated using the following formulas.

$$\sin(a) = (\Delta Y1 - Y\phi)/r \quad (1)$$

$$\sin(b) = (\Delta Y2 - Y\phi)/r \quad (2)$$

$$\cos(a) = (\Delta X1 - X\phi)/r \quad (3)$$

$$\cos(b) = (\Delta X2 - X\phi)/r \quad (4)$$

Also, since a+b=A, then $$\sin(A-a) = \sin(b) = \sin(A)\cos(a) - \cos(A)\sin(a) \quad (5)$$

(Substitute (1), (2) and (3) in (5))

$$(\Delta Y2 - Y\phi)/r = \sin(A)(\Delta X1 - X\phi)/r - \cos(A)(\Delta X2 - X\phi)/R \quad (6)$$

(multiply (6r) by )

$$\Delta Y2 - Y0 = (\Delta X - X0)\sin(A) - (\Delta X2 - X0)\cos(A) \quad (6)$$

Similarily, $$\sin(A-b) = \sin(a) = \sin(A)\cos(b) - \cos(A)\sin(b) \quad (7)$$

(Substitute (1), (2) and (4) in (7) and multiply by (r))

$$\Delta Y1 - Y0 = (\Delta X2 - X0)\sin(A) - (\Delta Y2 - Y0)\sin(A) \quad (8)$$

(Substitute (6) for ΔY2 − Y0 in (8))

$$\Delta Y1 - Y0 - (\Delta X2 - X0)\sin(A) - \cos(A)*[(\Delta X1 - X0)\sin(A) - (\Delta Y1 - Y0)\cos(A)] \quad (9)$$

(Multiply out and rearrange terms)

$$(\Delta Y1 - Y0)[1 - \cos^2(A)] = (\Delta X2 - X0)\sin(A) - (\Delta X1 - X0)\sin(A)\cos(A) \quad (9)$$

(substitute for $1 - \cos^2(A) = \sin^2(A)$ and divide equation by sin (A))

$$(\Delta Y1 - Y0)\sin(A) = \Delta X2 - X0 - (\Delta X - X0)\cos(A) \quad (10)$$

Rearranging the terms in (10), the equation for the ΔY1−Y0 in terms of the knowns ΔX1−X0, ΔX2−X0, and the angle A is:

$$(\Delta Y1 - Y0) = (1/\sin(A))*[(\Delta X2 - X0) - (\Delta X1 - X1)\cos(A)]$$

After the calculations have been made in accordance with the above discussion, the location of the longest lead 30 precisely known with respect to the axis (identified in the plane by points XO and Y0) of rotation of the gripper 12 known. Since the location of the gripper 12 is precisely known with respect to the robot 10 and the circuit board 19, the position information necessary to insert the leads 28 and 30 into the circuit board 19, is avaliable.

The insertion process will be described with reference to FIGS. 6 and 7 which illustrate the insertion of the leads 28 and 32 into circuit board 19. (Only a fragment of circuit board 19 is illustrated.) The first step in the insertion process is to position the robot 10 such that the longer lead 30 is precisely located above the opening in the circuit board 19 through which it is to be inserted. In this position, the component 18 is moved such that the longest lead 30 extends slightly into the opening in the circuit board 19. Then the robot 30 moves, as necessary to, position the shorter lead 28 above the opening in the circuit board 19 and to which it is to be inserted. Then the program robot is programmed to complete the insertion as illustrated in FIG. 7. This process permits components whose leads are not precisely preformed to a spacing matching the spacing of the holes into which the leads are to be inserted, to be assembled.

The above illustrated process is repeated for each component to be mounted on circuit board 19. Interconnections between the components on the circuit board 19 may be provided using conventional techniques, such as printed wiring. Although the typical component 22 is what is commonly referred to as a "can" type component "radial" type components such as conventional resistors can be mounted using this technique.

Although the invention has been described above with respect to assembling electronic circuit boards, it is obvious that similar techniques can be used to assemble other mechanical device.

I claim:

1. A robotic system for assembling electronic circuit boards, comprising in combination:
   (a) a multi-axis robot including a gripper mechanism for holding a component, said component including at least a plurality of substantially parallel leads, each of said leads having a different length, each of said leads adapted for inserting into predetermined opening in said circuit board;
   (b) means for controlling said robot, thereby causing said gripper to acquire said component and for selectively positioning said component relative to said robot;
   (c) optical sensor means for producing a plurality of differing images of said leads and position calculating means utilizing said differing images for determining the position of each of said leads relative to said robot;
   (d) support means for supporting said circuit board at a known location relative to said robot;
   (e) control means for operating said robot to individually insert each of said plurality of leads into said circuit board.

2. A robotic system for assembling electronic circuit boards, comprising in combination:

(a) a multi-axis robotic including a gripper mechanism for holding a component, said component including a plurality of trimmed and preformed leads, each of said plurality of leads adapted for inserting individually into individual openings in said circuit board;

(b) optical sensor means including a TV camera for sensing said plurality of trimmed and preformed lead and for determining the position of each of said plurality of leads relative to said robot;

(c) support means for supporting said circuit board in a fixed position relative to said robot;

(d) control means for selectively positioning said gripper mechanism relative to said circuit board to insert said plurality of trimmed and preformed lead into an opening in said circuit board.

3. A robotic system in accordance with claim 2, further including:

(a) means for selectively rotating said component such that said TV camera produces at least three differing images of said plurality of leads; and (b) arithmetic means for calculating the displacement of said plurality of leads from a reference location using each of said TV images.

4. A robotic system in accordance with claim 3 further including back-lighting means for illuminating said lead.

5. A robotic system in accordance with claim 4 wherein said component includes a plurality of trimmed and preformed leads and further including:

(a) control means for partially inserting a first lead of said component into a first hole in said circuit board;

(b) control means for repositioning said component and partially inserting a second lead of said component into a second hole in said circuit board;

(c) control means for sequentially partially inserting the remainder of the leads of said component; and (d) control means for repositioning said component to fully insert all the leads of said component.

6. A method of individually determining the location of a plurality of leads of an electronic component with respect to a robotically operated gripper, as said component is held by said robotically operated gripper, comprising the steps of:

(a) operating a robot to position said component within the view of an optical sensor means;

(b) operating said robot to rotate said component about a fixed axis and operating said optical sensor means to produce at least three images of the leads of said component; and (c) using said at least three images of said leads, calculate the displacement of said leads from a predetermined reference point.

7. The method of claim 6 wherein at least two of said images are angularly separated by substantially 180°.

8. The method of claim 7 further including the steps of:

(a) trimming said leads such that all the leads have a different length;

(b) utilizing the length of each of said leads to uniquely identify each of said leads in each of said images.

* * * * *